United States Patent [19]

Itoh

[11] Patent Number: 5,806,174
[45] Date of Patent: Sep. 15, 1998

[54] APPARATUS FOR MOUNTING ELECTRONIC COMPONENTS

[75] Inventor: Hiroshi Itoh, Hamamatsu, Japan

[73] Assignee: Tenryu Technics Co., Ltd., Hamamatsu, Japan

[21] Appl. No.: 752,183

[22] Filed: Nov. 18, 1996

[30]      Foreign Application Priority Data

May 14, 1996  [JP]  Japan ................................. 8-118755

[51] Int. Cl.⁶ ............................ H05K 3/30; H05K 13/04
[52] U.S. Cl. ................................ 29/740; 29/708; 29/709; 29/712; 29/742; 29/743; 294/64.1; 414/737; 414/752
[58] Field of Search ............................ 29/740, 741, 742, 29/743, 707, 708, 709, 712, 721; 294/2, 64.1; 414/737, 752; 901/40

[56]          References Cited

U.S. PATENT DOCUMENTS

| | | | |
|---|---|---|---|
| 4,624,050 | 11/1986 | Hawkswell | 29/740 |
| 4,631,812 | 12/1986 | Young | 29/740 X |
| 5,191,702 | 3/1993 | Goedecke et al. | 29/742 |
| 5,323,528 | 6/1994 | Baker | 29/740 X |
| 5,397,423 | 3/1995 | Bantz et al. | 29/742 X |
| 5,495,661 | 3/1996 | Gromer et al. | 29/740 |
| 5,692,292 | 12/1997 | Asai et al. | 29/743 X |

FOREIGN PATENT DOCUMENTS

| | | | |
|---|---|---|---|
| 390046 | 10/1990 | European Pat. Off. | 29/740 |
| 5075299 | 3/1993 | Japan | 29/740 |

*Primary Examiner*—Peter Vo
*Attorney, Agent, or Firm*—Kanesaka & Takeuchi

[57]           ABSTRACT

In an apparatus for mounting electronic components of the invention, a moving part is attached to a frame of the apparatus and moved freely in front and rear directions by a moving device. Also, first and second movable members are attached to the moving part and freely and independently moved in right and left directions by first and second moving members. First and second fitting heads are attached to the first and second movable members, and independently and freely moved between a supply section and a mounting section in the frame. When the electronic components are held at the first and second fitting heads, the first fitting head moves the electronic components from the supply section to mount onto a substrate in one mounting section, and the second head moves the electronic components from the supply section to mount on a substrate of a different mounting section in the apparatus.

8 Claims, 6 Drawing Sheets

5,806,174

APPARATUS FOR MOUNTING ELECTRONIC COMPONENTS

BACKGROUND OF THE INVENTION AND RELATED ART STATEMENT

The present invention relates to an apparatus for mounting electronic components and a method thereof used in the electronic component mounting or assembling industry.

Conventionally, in the industry for assembling or mounting electronic components, such as chip members and IC members, as shown in FIG. 6, electronic components are mounted by a mounting device in which a single or plurality of fitting heads 81 is attached to a head moving member 80. In the mounting device, the heads 81 suck and hold electronic components 83 provided in a component supply part 82, and mount the same onto a printed substrate or a print board 84.

However, for example, when the electronic components 83 in the component supply part 82 located at a front left side of a frame 86 in FIG. 6 are received and transferred to a distant rear right side of the frame 86, moving distance thereof is relatively long to thereby take a long moving time. Therefore, high speed mounting time or mounting tact time which has been desired in the industry can not be achieved.

Accordingly, the present invention has been made to solve the foregoing problem, and it is an object of the present invention to provide an apparatus for mounting electronic components and a method thereof, wherein a moving amount or distance of fitting heads for mounting the electronic components is reduced and a mounting time can be reduced as short as possible.

SUMMARY OF THE INVENTION

To achieve the above object, the present invention provides an apparatus for mounting electronic components comprising: a moving part disposed in a frame and freely moved by a moving device in front and rear directions; first and second movable members attached to the moving part and freely and independently moved by first and second moving means in right and left directions; and first and second fitting heads attached to the first and second movable members and freely moved between a supply part and a mounting part by the moving device and first and second moving means.

Also, in the apparatus of the invention, the first and second heads are attached to the first and second movable members such that moving positions of the heads overlap with each other. Also, on one or both facing sides of the first and second fitting heads which face with each other, shock absorbing means may be fixed for absorbing a shock when the first and second fitting heads collide with each other.

Furthermore, the apparatus of the invention may include detecting means disposed at one or both facing sides of the first and second fitting heads and detecting an approach condition between the first and second fitting heads, and control means for preventing a collision between the fitting heads based on a detected signal from the detecting means.

Some of the electronic components are mounted onto a substrate located on the first mounting section by the first fitting head, and some of the electronic components are mounted onto a substrate located on the second mounting section by the second fitting head.

In particular, the first fitting head mounts electronic components onto a substrate located in a substantially left half of a mounting part, and the second fitting head mounts electronic components onto a substrate located in a substantial right half of the mounting part.

The present invention has the following operation.

Generally, a pair of right and left, i.e. the first and second, fitting heads is operated by the moving means. In regard to the substrate located in the substantial left half of the mounting part, the electronic components received from the supply part are mounted by the first fitting head corresponding to the left half of the mounting part. Also, In regard to the substrate located in the substantial right half of the mounting part, the electronic components are mounted by the second fitting head corresponding to the right half of the mounting part.

By providing the shock absorbing means in one or both of the first and second fitting heads, in case the both fitting heads collide, a caused shock can be absorbed.

Further, by providing the detecting means in one or both of facing sides of the first and second fitting heads, the collision of the both heads can be preliminary prevented.

DETAILED DESCRIPTION OF PREFERRED EMBODIMENTS

An embodiment of an apparatus for mounting electronic components and a method for mounting the electronic components by using the same according to the present invention will be explained with reference to the drawings hereinafter.

Figure 1:
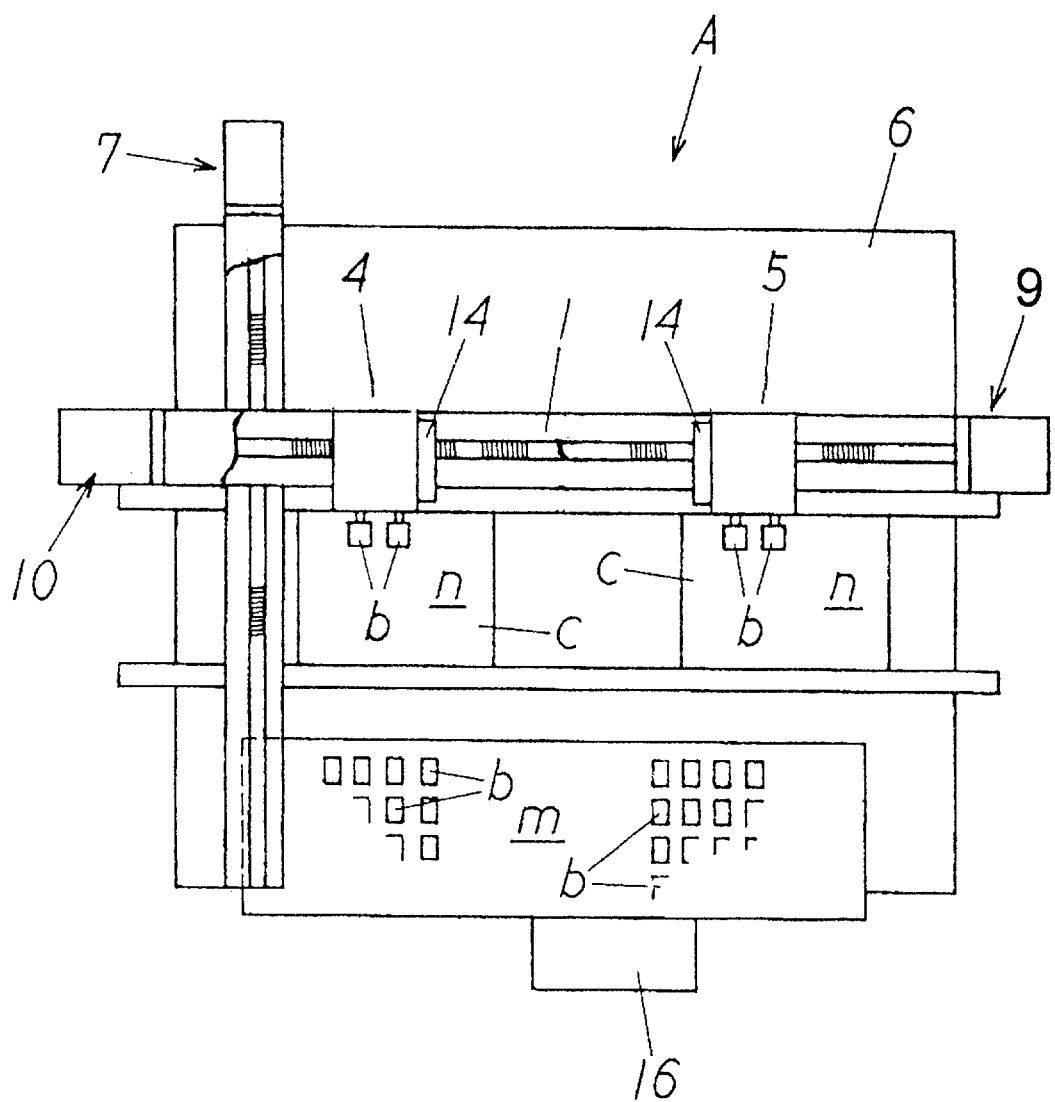
FIG. 1 is a plan view schematically showing an embodiment of an apparatus for mounting electronic components, which also adopts a method for mounting the electronic components according to the present invention.
Figure 5:
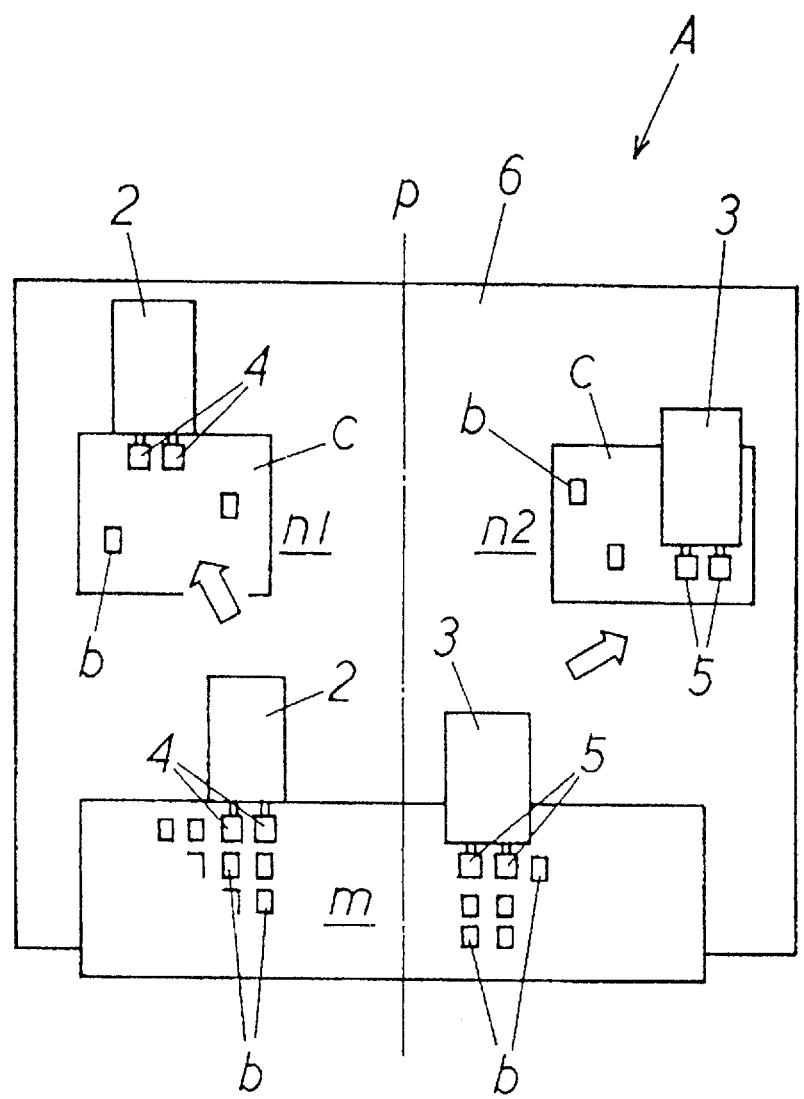
FIG. 5 is an explanatory view explaining a mounting method by the apparatus of FIG. 1.
Figure 6:
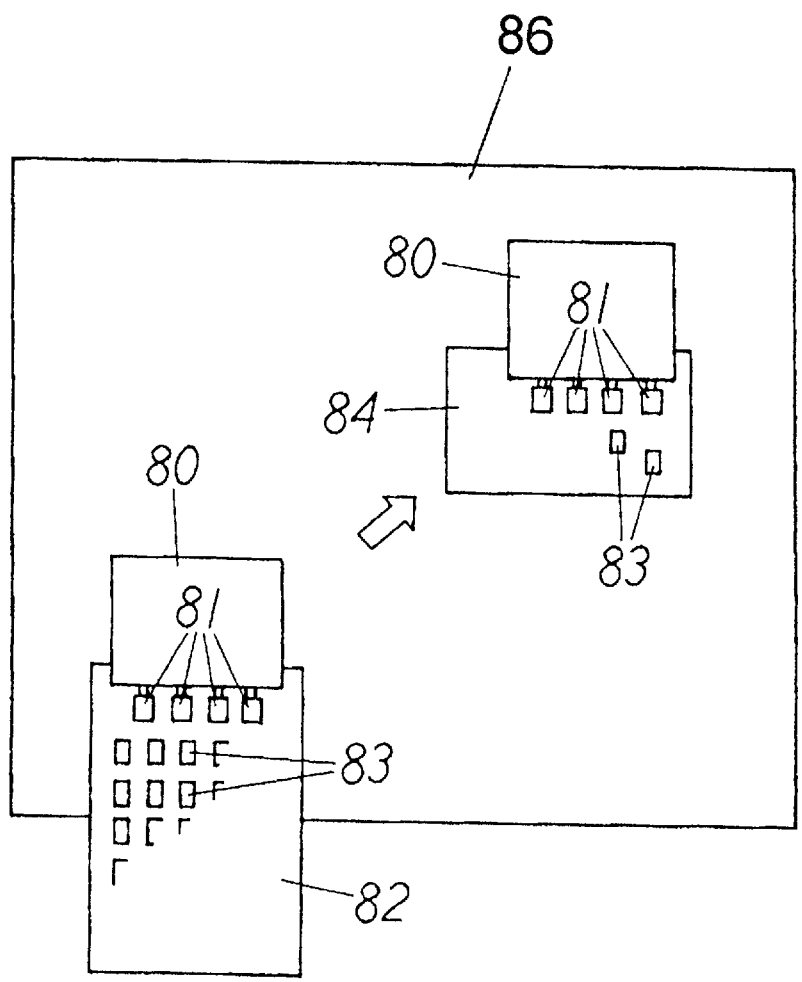
FIG. 6 is an explanatory view showing a mounting state of the electronic components by a conventional apparatus.

In FIGS. 1 and 5, A designates an apparatus for mounting electronic components wherein electronic components or parts, such as chip members and IC members, are received from a supply part m and transferred to mounting parts n to be attached to predetermined positions on a printed substrate or print board c. The apparatus A is basically formed of a moving part 1, first and second movable members 2, 3, and first and second fitting heads 4, 5.

In the apparatus A, on one side of a frame or body 6, there is disposed the supply part m for electronic components b to be sequentially transferred by a part feeder or the like for storing. Inside the frame 6, there are disposed the mounting parts n, to which different electronic parts, such as a print board is transferred by transferring means (not shown) for mounting the electronic components b thereto.

Figure 3:
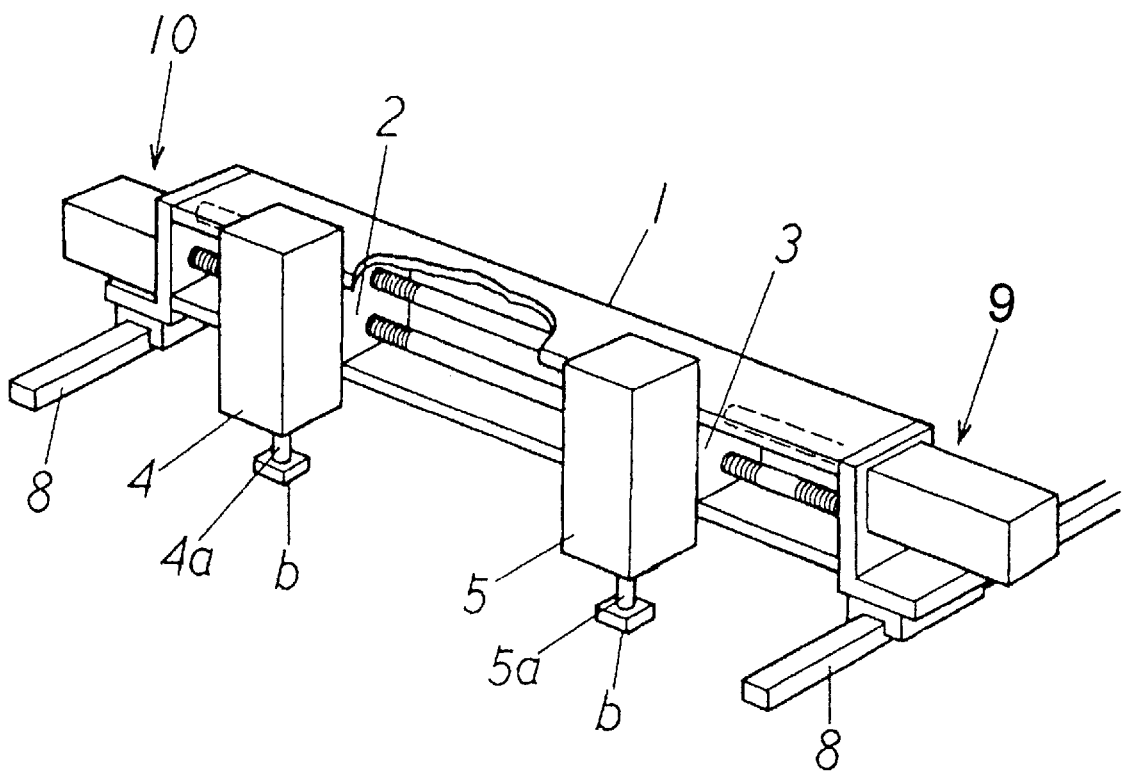
FIG. 3 is a perspective view of a main part of FIG. 2.

The moving part 1 is attached to the frame 6 and is moved, as desired, in the front and rear directions (X-axis direction) along first guides 8 (FIG. 3) by driving means 7, which is formed of a spiral shaft and a numerically controllable servomotor or the like engaging the spiral shaft.

The first and second movable members 2, 3 are independently moved in right and left directions (Y-axis direction)

along second guides 11 by first and second moving means 9, 10, which are formed of spiral shafts and numerically controllable servomotors or the like engaging the spiral shafts. The first and second movable members 2, 3 are disposed upper and lower parts of the moving part 1.

The first and second fitting heads 4, 5 are respectively attached to the first and second movable members 2, 3 such that the respective moving positions or areas of the heads overlap with each other, and the heads 4, 5 are engaged to be freely ascendable and descendable by the ascending means 12 and to be freely rotatable around a vertical axis by rotating means 13. By the driving means 7 and the first and second moving means 9, 10, the first and second heads 4, 5 are freely moved between the supply part m and the mounting part n for the electronic components b in the frame 6. The ascending means 12 and the rotating means 13 are actuated with high accuracy by numerically controllable servomotors or the like.

Figure 2:
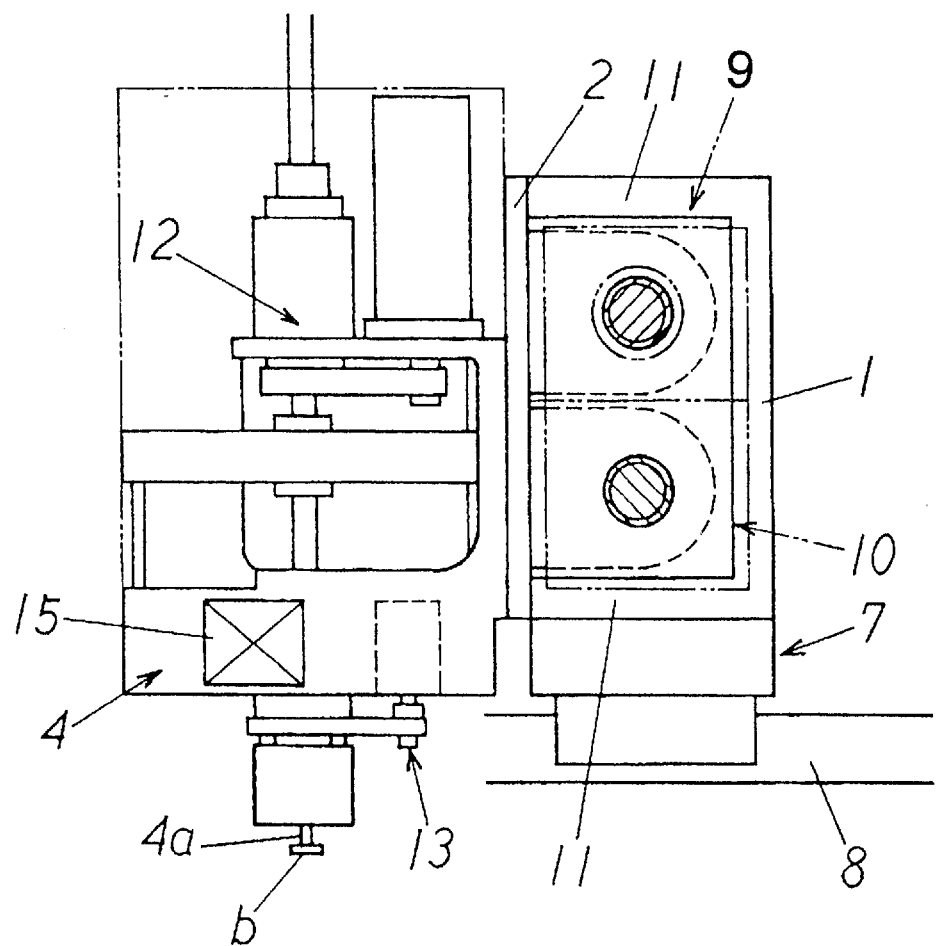
FIG. 2 is an enlarged side view showing an attachment state of a fitting head of FIG. 1 with respect to a movable member.

Incidentally, as the fitting heads 4, 5, there can be used a sucking pad type for sucking an upper surface of the electronic component b, or a chuck type for holding the outer periphery of the electronic component b. A head may be single, i.e. single holding portion, but if plural heads, i.e. plural holding portions, are used, fitting efficiency and the like can be improved. In the present embodiment, as shown in FIG. 2 (only the first fitting head 4 is shown), the head with the sucking pad type is shown, and sucking members 4a, 5a are attached to lower end portions of the fitting heads 4, 5.

Attachment positions of the sucking members 4a, 5a in the fitting heads 4, 5 correspond to the supply part m and the mounting part n, i.e. at the same height not to change the attachment conditions between the fitting heads 4, 5.

Then, one or both facing sides of the first and second fitting heads 4, 5 which face with each other are provided with shock absorbing means 14 for absorbing a shock when the first and second fitting heads collide with each other.

Figure 4:
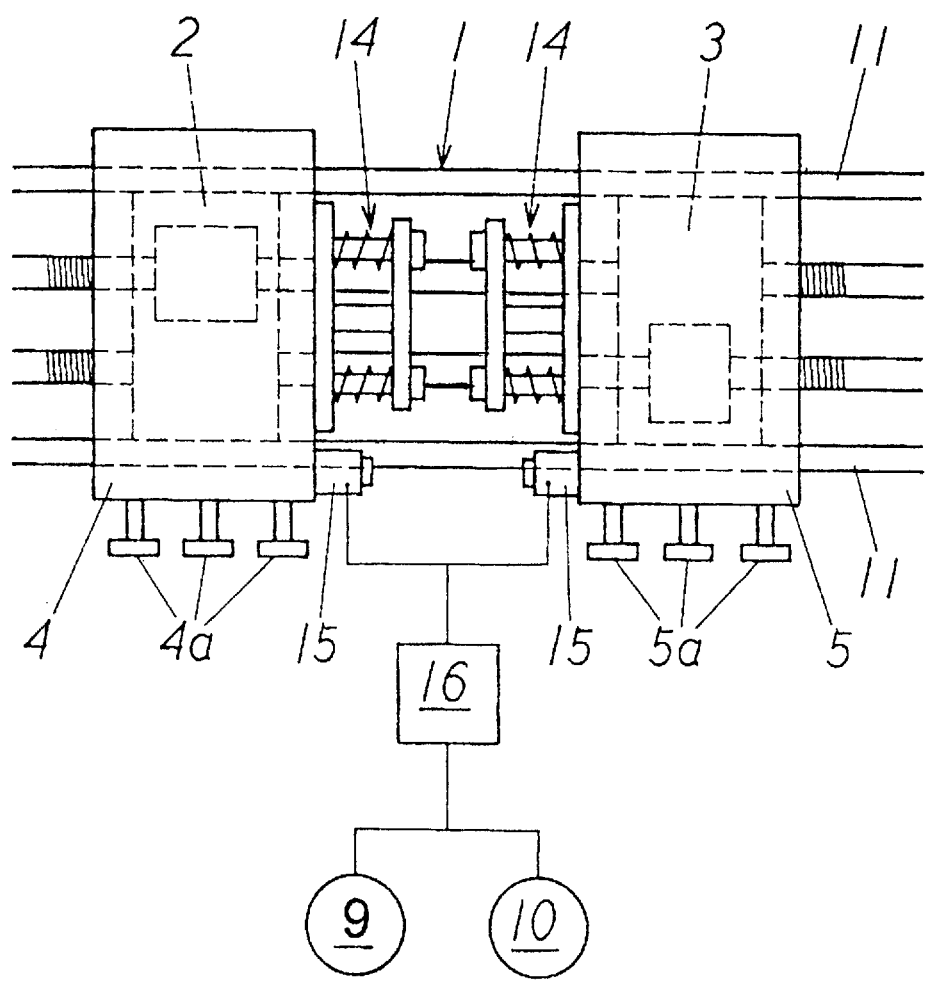
FIG. 4 is an explanatory view of a main part showing shock absorbing means and detecting means in FIG. 1.

As an embodiment of the shock absorbing means 14, a spring type damper as shown in FIG. 4, or an elastic member, such as an air cushion (not shown) adjusted at a predetermined air pressure can be used.

Also, one or both facing sides of the first and second fitting heads 4, 5 are provided with detecting means 15 for detecting an approach condition between the first and second fitting heads, such as a proximity switch, a photoelectric tube and a limit switch. A signal detected by the detecting means 15 is sent to control means 16 formed of a commonly used computer or the like, and based on the signal, one or both of the first and second moving means 9, 10 are controlled to prevent the collision of the fitting heads 4, 5.

Accordingly, the operation of the embodiment of the apparatus and method according to the invention are as follows.

As shown in FIG. 5, at the right and left sides relative to a substantially central line p in the frame 6, first and second mounting parts n1 and n2 are disposed, and on the printed substrates c (one or more substrates are disposed) provided on the first and second mounting parts n1 and n2, a predetermined number of the electronic components b from the supply part m (two supply parts may be provided corresponding to the first and second mounting parts n1 and n2) is mounted at the predetermined places. For this work, data of these setting points and assembly orders are preliminary programmed into the control means 16.

In mounting the electronic components b, the driving means 7, the first and second moving means 9, 10, the ascending means 12 and the rotating means 13 are operated, and the fitting heads 4, 5 are moved to the supply part m for electronic components b and receive the components b.

Then, as shown in FIG. 5, the first fitting head 4 corresponding to the first mounting part n1 is moved to the printed substrate c of the first mounting part n1 by the first movable member 2 actuated by the first moving member 9, and the electronic components b are loaded in accordance with the data inputted into the control means 16.

In case the printed substrate c is single, one of the first and second fitting heads 4, 5 loads the electronic component b on the printed substrate c, and then the other of the first and second fitting heads 4, 5 loads the electronic component b on the printed substrate c.

On the other hand, in the simultaneous operation with the first fitting head 4, the second fitting head 5 corresponding to the second mounting part n2 is moved to the printed substrate c of the second mounting part n2 by the second movable member 3 actuated by the second moving member 10, and the electronic components b are loaded in accordance with the data inputted into the control means 16.

During the operations of the first and second fitting heads 4, 5, in case the heads 4, 5 erroneously or by other reasons collide with each other, the shock absorbing means 14 disposed at the one or both facing sides of the fitting heads 4, 5 can absorb the shock thereof.

Furthermore, preferably, in case the first and second fitting heads 4, 5 are provided with the detecting means 15, when the fitting heads 4, 5 approach with each other, the detecting means 15 detects the approaching condition and sends the detected signal to the control means 16. According to the signal, the first and second fitting heads 4, 5 attached to the first and second movable members 2, 3 are controlled so that one or both of the first and second moving means 9, 10 stop or actuate in a manner to avoid the collision.

Incidentally, according to the apparatus A of the invention, the mounting works or operations by the first and second fitting heads 4, 5 need not be divided for the printed substrates c placed on the first mounting part n1 and the second mounting part n2. In this case, the first and second fitting heads 4, 5 can work cooperatively to mount the electronic components b on the printed substrate c in the same mounting part n, by which the electronic components can be mounted efficiently more than the conventional method using a single fitting head.

Even if the printed substrate is single, since the respective first and second fitting heads can independently suck the electronic components b in the supply part, the electronic components can be mounted on the single printed substrate efficiently.

Additionally, in the mounting part n as shown in FIG. 5, the line p as a boundary of the divided sections needs not be a center line of the frame 6, and as long as the sections are divided such that the fitting heads 4, 5 can work most efficiently, positions for sections can be freely decided, i.e., there may be a difference between areas of the sections.

Furthermore, three or more movable members with the fitting head may be formed on the moving part.

As described above, in the apparatus for mounting the electronic components and method thereof, since a pair of the fitting heads which are independently movable in the right and left directions is provided, when the fitting heads receive the electronic components and move to mount the same on the substrate, the moving distance can be shortened as little as possible. Therefore, mounting time or mounting tact time can be reduced remarkably, and a special effect of highly efficient mounting of the electronic components can be achieved.

While the invention has been explained with reference to the specific embodiments of the invention, the explanation is illustrative and the invention is limited only by the appended claims.

What is claimed is:

1. An apparatus for mounting electronic components comprising:

a frame having at least one supply section for supplying electronic components, and at least one mounting section for mounting the electronic components situated away from the supply section, a moving part movably attached to the frame in front and rear directions, first and second movable members arranged to overlap with each other and attached to the moving part to be freely and independently moved in right and left directions, first and second fitting heads attached to the first and second movable members, respectively, said first and second fitting heads moving freely independently relative to each other on a substantially entire area of the frame including an area between the at least one supply section and the at least one mounting section so that the electronic components are efficiently and selectively transferred to the at least one mounting section from the at least one supply section, and at least one shock absorbing means for elastically absorbing a shock when the first and second fitting heads collide with each other, said at least one shock absorbing means being attached to one of side surfaces of the first and second fitting heads facing each other.

2. The apparatus for mounting electronic components according to claim 1, wherein said at least one mounting section includes two mounting sections, and said at least one supply section includes two supply sections, said first fitting head supplying the electronic components from one of the mounting sections to one of the supply sections and said second fitting head supplying the electronic components from the other of the mounting sections to the other of the supply sections.

3. The apparatus for mounting electronic components according to claim 1, wherein said shock absorbing means is a spring type damper formed of springs and a plate at a front side thereof.

4. An apparatus for mounting electronic components according to claim 1, further comprising first moving means formed of a first shaft engaging the first movable member and a first motor connected to the first shaft for rotating the same; and second moving means formed of a second shaft engaging the second movable member and disposed parallel to the first shaft, and a second motor connected to the second shaft for rotating the same.

5. An apparatus for mounting electronic components according to claim 4, wherein the first and second heads including a plurality of sucking members, each of said sucking members sucking one electronic component at a time.

6. An apparatus for mounting electronic components comprising:

a frame having a supply section for supplying electronic components, and a mounting section for mounting the electronic components situated away from the supply section, a moving part movably attached to the frame in front and rear directions, first and second movable members arranged to overlap with each other and attached to the moving part to be freely and independently moved in right and left directions, first and second fitting heads attached to the first and second movable members, respectively, said first and second fitting heads moving freely independently relative to each other on a substantially entire area of the frame including an area between the supply section and the mounting section so that the electronic components are efficiently transferred to the mounting section from the supply section, detecting means disposed on at least one of side surfaces of the first and second fitting heads for detecting approach of the first and second fitting heads, and control means electrically connected to the detecting means, said control means receiving a signal for the approach from the detecting means and preventing a collision of the fitting heads.

7. The apparatus for mounting electronic components according to claim 6, wherein said detecting means is selected from the group consisting of a proximity switch, a photoelectric tube and a limit switch.

8. An apparatus for mounting electronic components according to claim 6, further comprising at least one shock absorbing means for elastically absorbing a shock when the first and second fitting heads collide with each other, said at least one shock absorbing means being a spring type damper attached to one of side surfaces of the first and second fitting heads facing each other.

* * * * *